(12) United States Patent
Bucaille

(10) Patent No.: US 12,411,456 B2
(45) Date of Patent: Sep. 9, 2025

(54) METHOD OF MAKING A TIMEPIECE SPRING FROM MONOCRYSTALLINE MATERIAL AND TIMEPIECE SPRING OBTAINED BY THIS METHOD

(71) Applicant: PATEK PHILIPPE SA GENEVE, Geneva (CH)

(72) Inventor: Jean-Luc Bucaille, Présilly (FR)

(73) Assignee: PATEK PHILIPPE SA GENEVE, Geneva (CH)

( * ) Notice: Subject to any disclaimer, the term of this patent is extended or adjusted under 35 U.S.C. 154(b) by 614 days.

(21) Appl. No.: 17/761,976

(22) PCT Filed: Sep. 8, 2020

(86) PCT No.: PCT/IB2020/058319
§ 371 (c)(1),
(2) Date: Mar. 18, 2022

(87) PCT Pub. No.: WO2021/053454
PCT Pub. Date: Mar. 25, 2021

(65) Prior Publication Data
US 2022/0326657 A1    Oct. 13, 2022

(30) Foreign Application Priority Data

Sep. 20, 2019    (EP) .................................... 19198559

(51) Int. Cl.
*G04B 17/32*    (2006.01)
*C30B 29/06*    (2006.01)
(Continued)

(52) U.S. Cl.
CPC .............. *G04B 17/32* (2013.01); *C30B 29/06* (2013.01); *C30B 29/66* (2013.01); *G04B 17/06* (2013.01);
(Continued)

(58) Field of Classification Search
CPC ........ G04B 17/32; G04B 17/06; C30B 29/06; C30B 29/66; C30B 33/08; F16F 2224/02; F16F 2226/04; F16F 2230/24
(Continued)

(56) References Cited

U.S. PATENT DOCUMENTS 3,524,636 A * 8/1970 Duhl ....................... F16F 1/021
                                                                    267/166
9,541,148 B1 * 1/2017 DeMange ............... C30B 29/52
(Continued)

FOREIGN PATENT DOCUMENTS

EP    1 445 670    8/2004
EP    2 175 328    4/2010
(Continued)

OTHER PUBLICATIONS

Tsuyoshi Ikehara, et al., "Crystal orientation-dependent fatigue characteristics in micrometer-sized single-crystal silicon", Microsystems & Nanoengineering, vol. 2, No. 1, Jul. 18, 2016, pp. 1-9.
(Continued)

*Primary Examiner* — Edwin A. Leon
*Assistant Examiner* — Kevin Andrew Johnston
(74) *Attorney, Agent, or Firm* — NIXON & VANDERHYE

(57) ABSTRACT

Disclosed is a method of making a timepiece spring from monocrystalline material including the following steps: drawing the spring; identifying one or more zones of weakness of the spring in which or in at least one of which the spring will break in the event of excessive deformation; manufacturing the spring from a wafer of monocrystalline material extending in a determined plane, while orienting the spring in the wafer such that the direction of the macroscopic stresses in the or each zone of weakness when the spring is deformed is substantially parallel to a plane of (Continued)

cleavage of the material intersecting the determined plane. Also disclosed is a timepiece spring obtained by such a method.

20 Claims, 2 Drawing Sheets

(51) Int. Cl.
*C30B 29/66* (2006.01)
*C30B 33/08* (2006.01)
*G04B 17/06* (2006.01)
*G04B 21/06* (2006.01)

(52) U.S. Cl.
CPC ........... *C30B 33/08* (2013.01); *F16F 2224/02* (2013.01); *F16F 2226/04* (2013.01); *F16F 2230/24* (2013.01); *G04B 21/06* (2013.01)

(58) Field of Classification Search
USPC ....................................................... 368/177
See application file for complete search history.

(56) References Cited

U.S. PATENT DOCUMENTS

| | | | |
|---|---|---|---|
| 2002/0135846 A1* | 9/2002 | Miyajima | G02B 26/105 359/224.1 |
| 2016/0238994 A1* | 8/2016 | Ching | C30B 29/06 |
| 2017/0285573 A1* | 10/2017 | Manousos | G04B 19/12 |

FOREIGN PATENT DOCUMENTS

| | | | |
|---|---|---|---|
| EP | 3 056 948 | 8/2016 | |
| EP | 3 252 545 | 12/2017 | |
| JP | 2002-072127 | 3/2002 | |
| WO | 2007/000271 | 1/2007 | |
| WO | WO-2009068091 A1 * | 6/2009 | ............ G04B 1/145 |
| WO | 2018/115014 | 6/2018 | |

OTHER PUBLICATIONS

International Search Report and Written Opinion of the ISA for PCT/IB2020/058319 dated Dec. 7, 2020, 11 pages.

* cited by examiner

Fig.3
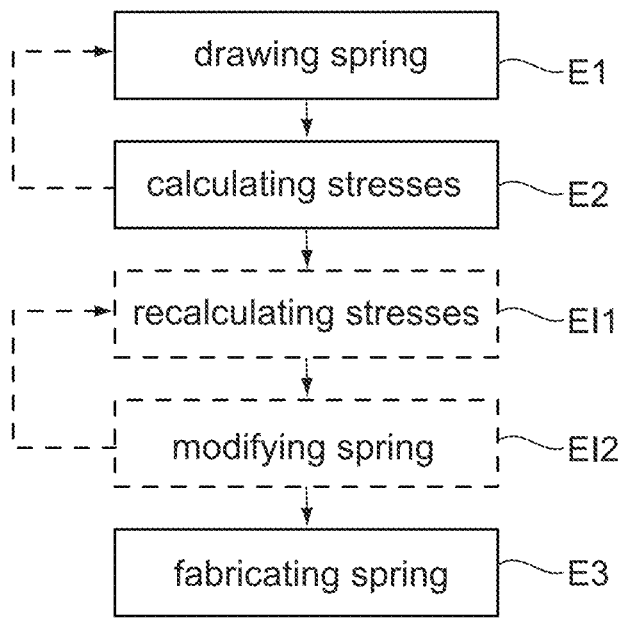
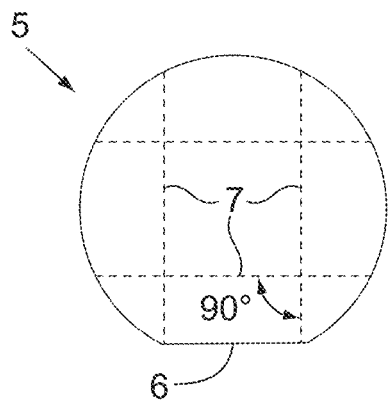
Fig.4(a)
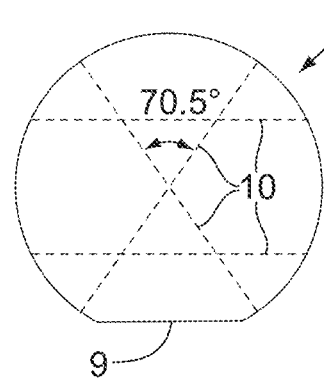
Fig.5(a)
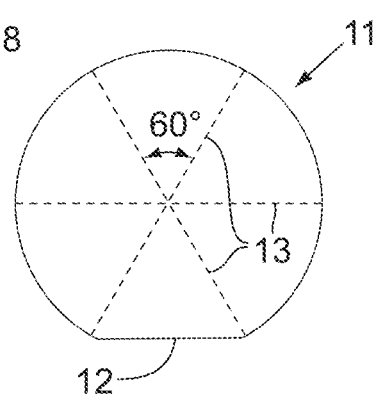
Fig.6(a)
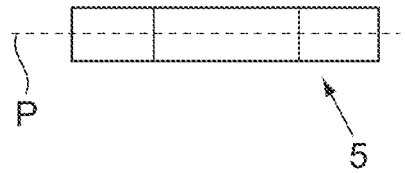
Fig.4(b)
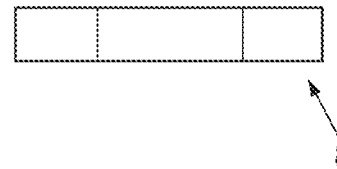
Fig.5(b)
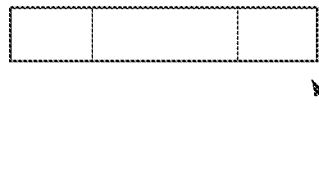
Fig.6(b)

METHOD OF MAKING A TIMEPIECE SPRING FROM MONOCRYSTALLINE MATERIAL AND TIMEPIECE SPRING OBTAINED BY THIS METHOD

CROSS-REFERENCE TO RELATED APPLICATIONS

This application is the U.S. national phase of International Application No. PCT/IB2020/058319 filed Sep. 8, 2020 which designated the U.S. and claims priority to European Patent Application No. 19198559.7 filed Sep. 20, 2019, the entire contents of each of which are hereby incorporated by reference.

BACKGROUND OF THE INVENTION

Field of the Invention

The present invention relates to a timepiece spring made of monocrystalline material, in particular of monocrystalline silicon. It also relates to a method for producing such a timepiece spring. By the term "spring" is meant any elastically deformable element for receiving energy and/or producing a force or a motion.

Description of the Related Art

Monocrystalline silicon is a very popular material in mechanical watchmaking for its advantageous properties, in particular its low density, its high resistance to corrosion, its non-magnetic character and its ability to be machined by micro-fabrication techniques. It is used to manufacture balance springs, balance wheels, flexibly guided oscillators, escapement anchors and escape wheels.

However, this material has the disadvantage of low mechanical strength. It can break easily without prior plastic deformation under external stresses.

To mitigate this disadvantage, it is customary to reinforce the silicon with a silicon oxide coating, as proposed in patent application WO 2007/000271.

In the case of a spring, it is important that the mechanical strength is as high as possible because, in addition to the shocks or accelerations that it may receive during its assembly in the movement or when the watch is worn, it must be able to deform elastically without breaking in order to perform its function and must also be able to resist fatigue.

SUMMARY OF THE INVENTION

The present invention aims at proposing a new approach to increase the mechanical strength of a timepiece spring made of monocrystalline silicon, which may be combined or not with the approach consisting in coating the silicon with silicon oxide or with any other treatment method aimed at improving the mechanical strength.

More generally, the present invention aims at providing a new approach to increase the mechanical strength of a timepiece spring made of monocrystalline material.

To this end, a method for making a timepiece spring from monocrystalline material is provided comprising the following steps:
a) drawing the spring,
b) identifying one or more zones of weakness in the spring in which, or in at least one of which, the spring will break in the event of excessive deformation,
c) fabricating the spring from a wafer of monocrystalline material extending in a determined plane, while orienting the spring in the wafer such that the direction of macroscopic stresses in the or each zone of weakness when the spring is deformed is substantially parallel to a cleavage plane of the material intersecting the determined plane.

The present invention also proposes a timepiece spring made of monocrystalline material, which is elastically deformable in a determined plane and comprises one or more zones of weakness in which or in at least one of which the spring breaks in the event of excessive deformation, characterised in that the direction of the macroscopic stresses in the or each zone of weakness when the spring is deformed is substantially parallel to a cleavage plane of the material intersecting the determined plane.

The present invention further provides a timepiece movement and a timepiece comprising such a spring.

BRIEF DESCRIPTION OF THE DRAWINGS

Other features and advantages of the present invention will become apparent from the following detailed description made with reference to the attached drawings in which:

FIG. 3 is a diagram showing the different steps of the method according to the invention;

FIG. 4 shows schematically in top view (FIG. 4(a)) and in profile view (FIG. 4(b)) a (100) monocrystalline silicon wafer with a [110] wafer flat;

FIG. 5 shows schematically in top view (FIG. 5(a)) and in profile view (FIG. 5(b)) a (110) monocrystalline silicon wafer with a [100] wafer flat;

FIG. 6 shows schematically in top view (FIG. 6(a)) and in profile view (FIG. 6(b)) a (111) monocrystalline silicon wafer with a [112] wafer flat.

DESCRIPTION OF THE PREFERRED EMBODIMENTS

Figure 1:
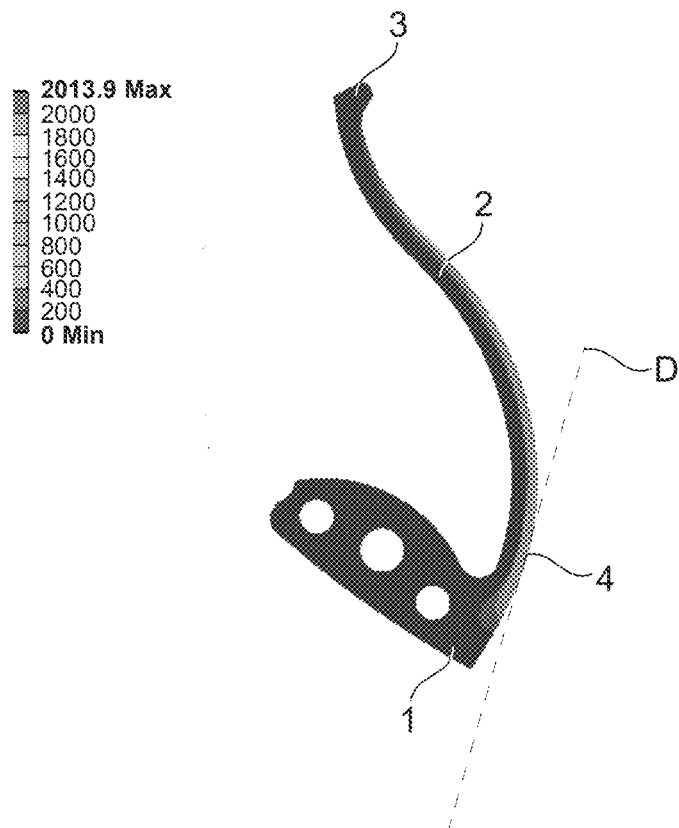
FIG. 1 is a top view of an example of a timepiece spring that can be made by the method according to the invention, the spring being represented in a deformed state, more precisely in its state of maximum deformation in normal operation, and the tensile stresses to which it is subjected being represented by shades of grey.
Figure 2:
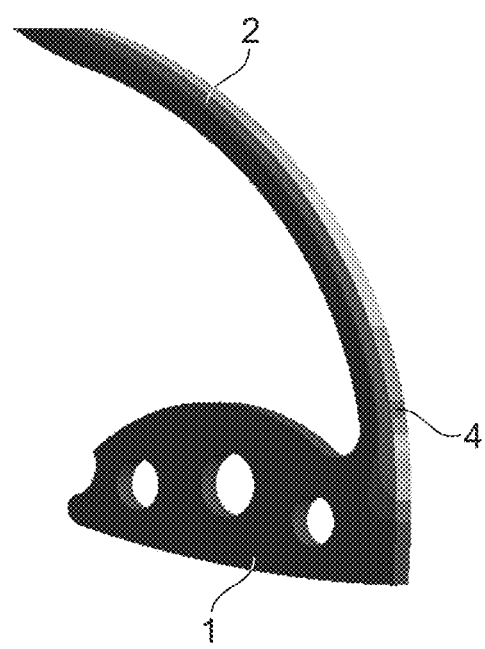
FIG. 2 is a perspective view of a portion of the timepiece spring illustrated in FIG. 1, with the tensile stresses represented by shades of grey.

FIGS. 1 and 2 show a timepiece spring, in this case a rocker spring, comprising a rigid base 1 and an elastic arm 2. The rigid base 1 is intended to be attached to a fixed or mobile frame of a timepiece movement, typically to the plate of the movement. The elastic arm 2 extends from the rigid base 1 and performs the spring function. In use, the elastic arm 2 works in bending and acts on the rocker by its free end 3 to return it to a determined angular position. To manufacture such a spring in monocrystalline silicon, the present invention proposes, according to a particular embodiment, the method illustrated in FIG. 3 and described below, with its steps E1 to E3.

The spring is first drawn by computer-aided design (step E1) while taking into account the function it is intended to perform and the location it is intended to occupy in the movement.

The magnitude and direction of the macroscopic stresses experienced by the spring when it is loaded in bending under its normal conditions of use are then calculated by the finite element method (step E2). The calculation takes into account the dimensions of the spring and the elastic characteristics (modulus of elasticity and Poisson's ratio) of the material. In the case of an anisotropic monocrystalline silicon, an average modulus of elasticity and an average Poisson's ratio can be used at this stage. As silicon is much less resistant in tension than in compression, the simulation can be limited to the side of the elastic arm 2 that works in tension during bending, i.e. the right-hand side in FIG. 1. The area 4 of the spring where the tensile stresses are greatest is the zone of weakness in which the spring will break as from a certain force applied to its free end. The calculation in this step E2 can be performed for the state of maximum deformation of the spring during its normal operation in the movement. However, experience shows that the position of the zone of weakness 4 and the direction of the macroscopic stresses in this zone hardly vary with the degree of deformation.

The spring is then fabricated by etching, e.g. deep reactive ion etching (DRIE) or laser etching, a wafer of monocrystalline silicon (step E3). The etching is carried out in such a way that the spring has a particular orientation in the wafer, namely an orientation such that the direction D of the stresses in the zone of weakness 4 is parallel to a cleavage plane of the monocrystalline silicon intersecting the mean plane P (see FIGS. 4 to 6) in which the wafer extends and in which the spring will be deformed in use.

Monocrystalline silicon has a diamond-like cubic crystal structure with one atom (i) at each of the eight vertices of the cube, (ii) at the centre of each of the faces of the cube, (iii) in four of the eight tetrahedral sites of the cube, i.e. at the centre of the tetrahedron formed by one corner of the cube and the three atoms at the centre of the three adjacent faces of that corner. The most atomically dense crystallographic planes are cleavage planes, i.e. planes of weakness along which the material fractures when subjected to excessive stress. In the case of monocrystalline silicon, the cleavage planes are the planes of the {111} family. FIG. 4 shows a monocrystalline silicon wafer 5 cut in the (100) plane with a wafer flat 6 oriented in the [110] direction. The dotted lines 7 represent the intersections between the (100) plane and planes of the {111} family. FIG. 5 shows a monocrystalline silicon wafer 8 cut in the (110) plane with a wafer flat 9 oriented in the [100] direction. The dotted lines 10 represent the intersections between the (110) plane and planes of the {111} family. Finally, FIG. 6 shows a monocrystalline silicon wafer 11 cut in the (111) plane with a wafer flat 12 oriented in the [112] direction. The dotted lines 13 represent the intersections between the (111) plane and other planes of the {111} family. The said intersections 7, 10 and 13 between the plane in which the wafer is cut and the planes of the {111} family constitute cleavage directions.

Thus, for example, in step E3 of the method according to the invention, the spring is oriented in the wafer in such a way that the direction D of the stresses in the zone of weakness 4 is parallel to one of the cleavage directions 7 if the spring is made of (100) silicon with a [110] wafer flat, to one of the cleavage directions 10 if the spring is made of (110) silicon with a [100] wafer flat and to one of the cleavage directions 13 if the spring is made of (111) silicon with a [112] wafer flat.

The spring shown in FIGS. 1 and 2 has a single zone of weakness. With other spring shapes, the spring may have several zones of weakness where the tensile stresses are maximum and the direction of the stresses may differ from one zone of weakness to another. If such a configuration is found in step E2, the spring is oriented in the silicon wafer so that the direction of the stresses in each zone of weakness is parallel to one of the cleavage planes. If this is not possible due to the crystallographic directions of the wafer, the spring is redrawn (step E1) and the stresses are recalculated (step E2) until a shape of the spring is found comprising a single zone of weakness or zones of weakness in which the respective directions of the stresses can each be parallel to one of the cleavage planes. In order to change the position of the zones of weakness and thus the direction of the stresses, the thickness of the elastic blade 2 can be varied. Instead of, or in addition to, changing the shape of the spring, a monocrystalline silicon wafer cut in another crystallographic plane can be chosen.

Between steps E2 and E3 the method according to the invention may comprise intermediate steps EI1 and EI2 consisting respectively in recalculating the stresses in the spring on the basis of the exact elastic characteristics taking into account the anisotropy of the material and the chosen orientation of the spring in the wafer, and in modifying the dimensions and/or the shape of the spring in order to obtain a desired stiffness and/or a desired stress at break. If the modification of the spring is such as to change the direction of the maximum stresses, and hence the choice of the orientation of the spring in the wafer, these intermediate steps can be implemented iteratively to refine the spring characteristics.

The mechanical strength of timepiece springs made according to the invention is significantly increased compared to springs whose direction of the maximum stresses is not parallel to any cleavage plane. In particular, tests carried out on two batches of nearly thirty specimens each, the specimens being made of (100) silicon coated with silicon oxide and being stressed in bending, showed that the median value of the rupture stress is about 4.7 GPa when the stresses in the zone of weakness are directed along a cleavage plane, as opposed to about 3.4 GPa when the stresses in the zone of weakness are directed at 45° with respect to a cleavage plane. This difference is far greater than the improvement that can be achieved by the difference in modulus of elasticity between the two orientations of the specimen. Such a result is surprising because, by stressing a cleavage plane as intended by the invention, one could have expected a decrease in the mechanical strength. One possible explanation is that the fracture starts from micro-cracks whose tips are subjected to microscopic stresses that do not have the same direction as the macroscopic stresses of the zone of weakness.

As mentioned above, the monocrystalline silicon springs made according to the invention can be covered with a reinforcing layer of silicon oxide. The thickness of such a layer is typically at least 0.5 µm and for example between 0.5 µm and 5 µm. Other types of reinforcement layers and/or other treatments to further increase the mechanical strength can be considered, such as a smoothing treatment of the surfaces of the springs.

The improvement in mechanical strength obtained by the invention may serve to reduce the dimensions of the spring for a given force exerted in normal operation and thus to reduce the space that it occupies in the timepiece movement.

The invention can be applied to various types of timepiece springs, in particular to rocker springs, hammer springs, lever springs, jumpers, flexible guidance devices (e.g. parallel blades guiding in translation or flexible pivots, in particular oscillator flexible pivots) or elastic parts of timepiece components (such as gearwheels or collets) used for mounting these components on support members such as shafts. In particular, the invention can be applied to the elastic arms of the balance spring collet shown in FIG. 10B of patent application EP 2175328.

The monocrystalline material of the springs made according to the invention is not necessarily silicon. In alternative embodiments of the invention, it may be diamond, aluminium oxide (e.g. sapphire or ruby) or silicon carbide.

The springs made according to the invention may be used in the movement of a wristwatch, pocket watch or miniature clock, for example.

The invention claimed is:

1. A method of making a timepiece spring from monocrystalline material comprising the following steps:
    a) drawing the spring,
    b) identifying one or more zones of weakness of the spring in which or in at least one of which the spring will break in the event of excessive deformation,
    c) fabricating the spring from a wafer of monocrystalline material, while orienting the spring in the wafer in such a way that the direction of macroscopic stresses in the or each zone of weakness when the spring is deformed is substantially parallel to a plane of cleavage of the monocrystalline material, the plane of cleavage intersecting a plane in which the wafer extends.

2. The method according to claim 1, wherein the step b) comprises a step of calculating the macroscopic stresses experienced by the spring when the spring is deformed.

3. The method according to claim 1, further comprising, between the steps b) and c), the following steps:
    (i) selecting an orientation for the spring in the wafer of monocrystalline material such that the direction of the macroscopic stresses in the or each zone of weakness when the spring is deformed is substantially parallel to a cleavage plane of the material intersecting the plane in which the wafer extends,
    (ii) modifying the spring on the basis of elastic characteristics of the monocrystalline material which take into account an anisotropy of said material and the choice of the orientation of the spring in the wafer.

4. The method according to claim 1, wherein the one or more zones of weakness are located in a part of the spring which is stressed in tension when the spring is deformed.

5. The method according to claim 1, wherein the spring comprises only one said zone of weakness.

6. The method according to claim 1, wherein the monocrystalline material is silicon, diamond, aluminium oxide or silicon carbide.

7. The method according to claim 1, wherein the timepiece spring is a rocker spring, a hammer spring, a lever spring, a jumper, a flexible guidance device or an elastic part of a timepiece component used for mounting this timepiece component on a support member.

8. The method according to claim 1, further comprising an additional treatment step for increasing the mechanical strength of the spring.

9. A timepiece spring made of monocrystalline material, wherein the timepiece spring is elastically deformable in a deformation plane and comprises one or more zones of weakness in which or in at least one of which the spring breaks in the event of excessive deformation, and wherein the direction of macroscopic stresses in the or each zone of weakness when the spring is deformed is substantially parallel to a plane of cleavage of the monocrystalline material, the plane of cleavage intersecting the deformation plane.

10. The timepiece spring according to claim 9, wherein the one or more zones of weakness are located in a part of the spring which is stressed in tension when the spring is deformed.

11. The timepiece spring according to claim 9, wherein the spring comprises only one said zone of weakness.

12. The timepiece spring according to claim 9, wherein the monocrystalline material is silicon, diamond, aluminium oxide or silicon carbide.

13. The timepiece spring according to claim 9, wherein the timepiece spring is a rocker spring, a hammer spring, a lever spring, a jumper, a flexible guidance device or an elastic part of a timepiece component used for mounting this timepiece component on a support member.

14. The timepiece spring according to claim 9, wherein the timepiece spring is covered with a reinforcing layer.

15. A timepiece movement comprising a timepiece spring according to claim 9.

16. A timepiece comprising a timepiece spring according to claim 9.

17. The method according to claim 2, further comprising, between the steps b) and c), the following steps:
    (i) selecting an orientation for the spring in the wafer of monocrystalline material such that the direction of the macroscopic stresses in the or each zone of weakness when the spring is deformed is substantially parallel to a cleavage plane of the material intersecting the plane in which the wafer extends,
    (ii) modifying the spring on the basis of elastic characteristics of the monocrystalline material which take into account an anisotropy of said material and the choice of the orientation of the spring in the wafer.

18. The method according to claim 2, wherein the one or more zones of weakness are located in a part of the spring which is stressed in tension when the spring is deformed.

19. The method according to claim 3, wherein the one or more zones of weakness are located in a part of the spring which is stressed in tension when the spring is deformed.

20. The method according to claim 2, wherein the spring comprises only one said zone of weakness.

* * * * *